US009356573B2

(12) United States Patent
Yokoyama et al.

(10) Patent No.: US 9,356,573 B2
(45) Date of Patent: May 31, 2016

(54) PIEZOELECTRIC THIN FILM RESONATOR, FILTER AND DUPLEXER INCLUDING A FILM INSERTED IN THE PIEZOELECTRIC FILM

(71) Applicant: TAIYO YUDEN CO., LTD., Tokyo (JP)

(72) Inventors: Tsuyoshi Yokoyama, Tokyo (JP);
Tokihiro Nishihara, Tokyo (JP);
Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/519,803

(22) Filed: Oct. 21, 2014

(65) Prior Publication Data

US 2015/0130559 A1    May 14, 2015

(30) Foreign Application Priority Data

Nov. 11, 2013  (JP) ................. 2013-233421

(51) Int. Cl.
*H03H 9/70*  (2006.01)
*H03H 9/02*  (2006.01)
(Continued)

(52) U.S. Cl.
CPC .......... *H03H 9/02118* (2013.01); *H01L 41/18* (2013.01); *H03H 9/13* (2013.01);
(Continued)

(58) Field of Classification Search
CPC ............ H03H 9/02102; H03H 9/0211; H03H 9/02118; H03H 9/13; H03H 9/132; H03H 9/173; H03H 9/174; H03H 9/175; H03H 9/568; H03H 9/587; H03H 9/588; H03H 9/706; H01L 41/18; H01L 41/187; H01L 41/1875; H01L 41/1876

USPC ......................................... 333/133, 187, 189
See application file for complete search history.

(56) References Cited

U.S. PATENT DOCUMENTS 4,456,850 A *  6/1984  Inoue ................. H03H 9/02102
                                                      310/324
8,084,919 B2 * 12/2011  Nishihara .......... H03H 9/02118
                                                      310/320

(Continued)

FOREIGN PATENT DOCUMENTS

CN     101064499 A    10/2007
CN     101796726 A     8/2010

(Continued)

OTHER PUBLICATIONS

U.S. Appl. No. 14/151,694, filed Jan. 9, 2014 and U.S. Appl. No. 14/527,335, filed Oct. 29, 2014.

(Continued)

*Primary Examiner* — Barbara Summons
(74) *Attorney, Agent, or Firm* — Chen Yoshimura LLP

(57) ABSTRACT

A piezoelectric thin film resonator includes: a piezoelectric film provided on a substrate; a lower electrode and an upper electrode sandwiching at least a part of the piezoelectric film and facing with each other; and an inserted film that is inserted in the piezoelectric film, is provided in an outer circumference region of a resonance region and is not provided in a center region of the resonance region, wherein: an angle between an edge face of the lower electrode and a lower face of the lower electrode in the resonance region is an acute angle; and a width of the inserted film in the resonance region on a side for extracting the upper electrode from the resonance region is larger than another width of the inserted film in the resonance region on a side for extracting the lower electrode from the resonance region.

9 Claims, 14 Drawing Sheets

(51) Int. Cl.
*H01L 41/18* (2006.01)
*H03H 9/13* (2006.01)
*H03H 9/17* (2006.01)
*H03H 9/56* (2006.01)

(52) U.S. Cl.
CPC .............. *H03H 9/132* (2013.01); *H03H 9/173* (2013.01); *H03H 9/175* (2013.01); *H03H 9/568* (2013.01); *H03H 9/706* (2013.01)

(56) References Cited

U.S. PATENT DOCUMENTS

| | | |
|---|---|---|
| 9,048,812 B2 | 6/2015 | Burak et al. |
| 9,099,983 B2 | 8/2015 | Burak et al. |
| 2006/0071736 A1 | 4/2006 | Ruby et al. |
| 2006/0091764 A1 | 5/2006 | Tsutsumi et al. |
| 2006/0103492 A1 | 5/2006 | Feng et al. |
| 2006/0279382 A1 | 12/2006 | Ohara et al. |
| 2007/0080611 A1 | 4/2007 | Yamada et al. |
| 2007/0252476 A1 | 11/2007 | Iwaki et al. |
| 2009/0206706 A1 | 8/2009 | Iwaki et al. |
| 2010/0033063 A1 | 2/2010 | Nishihara et al. |
| 2010/0141353 A1 | 6/2010 | Iwaki et al. |
| 2010/0148636 A1 | 6/2010 | Nishihara et al. |
| 2011/0006860 A1* | 1/2011 | Hara ........................ H03H 3/02 333/187 |
| 2012/0218060 A1 | 8/2012 | Burak et al. |
| 2014/0210570 A1 | 7/2014 | Nishihara et al. |
| 2015/0130559 A1 | 5/2015 | Yokoyama et al. |
| 2015/0130561 A1 | 5/2015 | Taniguchi et al. |

FOREIGN PATENT DOCUMENTS

| | | |
|---|---|---|
| CN | 101960717 A | 1/2011 |
| JP | 2006-109472 A | 4/2006 |
| JP | 2008-131194 A | 6/2008 |
| JP | 2008-219237 * | 9/2008 |

OTHER PUBLICATIONS

Chinese Office Action dated Mar. 4, 2016, in a counterpart Chinese patent application No. 201410042168.9.

* cited by examiner

PIEZOELECTRIC THIN FILM RESONATOR, FILTER AND DUPLEXER INCLUDING A FILM INSERTED IN THE PIEZOELECTRIC FILM

CROSS-REFERENCE TO RELATED APPLICATION

This application is based upon and claims the benefit of priority of the prior Japanese Patent Application No. 2013-233421, filed on Nov. 11, 2013, the entire contents of which are incorporated herein by reference.

FIELD

A certain aspect of the present invention relates to a piezoelectric thin film resonator, a filter and a duplexer and, in particular, relates to a piezoelectric thin film resonator, a filter and a duplexer that have an inserted film in a piezoelectric film.

BACKGROUND

An acoustic wave device using a piezoelectric thin film resonator is used as a filter and a duplexer of a wireless device such as a mobile phone. The piezoelectric thin film resonator has a structure in which a lower electrode and an upper electrode sandwiches a piezoelectric film and face with each other.

As a wireless system rapidly spreads, many frequency bands are used. As a result, a demand for sharpening skirt characteristic of the filter or the duplexer is enhanced. Enlarging a Q value of a piezoelectric thin film resonator is one of methods for sharpening the skirt characteristic. Leakage of acoustic wave energy from a resonance region to outside is one of factors of degradation of the Q value of the piezoelectric thin film resonator.

Japanese Patent Application Publication No. 2006-109472 (hereinafter referred to as Document 1) discloses a technology in which the Q value is improved by providing a ring band on a surface of a lower electrode or an upper electrode.

SUMMARY OF THE INVENTION

According to an aspect of the present invention, there is provided a piezoelectric thin film resonator including: a substrate; a piezoelectric film that is provided on the substrate; a lower electrode and an upper electrode that sandwich at least a part of the piezoelectric film and face with each other; and an inserted film that is inserted in the piezoelectric film, is provided in an outer circumference region of a resonance region in which the lower electrode and the upper electrode sandwich the piezoelectric film and face with each other and is not provided in a center region of the resonance region, wherein: an angle between an edge face of the lower electrode and a lower face of the lower electrode in the resonance region is an acute angle; and a width of the inserted film in the resonance region on a side for extracting the upper electrode from the resonance region is larger than another width of the inserted film in the resonance region on a side for extracting the lower electrode from the resonance region.

DETAILED DESCRIPTION

With the structure of Document 1, it is not possible to sufficiently suppress the acoustic wave energy leaked from the resonance region to outside. Therefore, the improvement of the Q value is not sufficient.

A description will be given of embodiments with reference to drawings.

First Embodiment

Figure 1A:
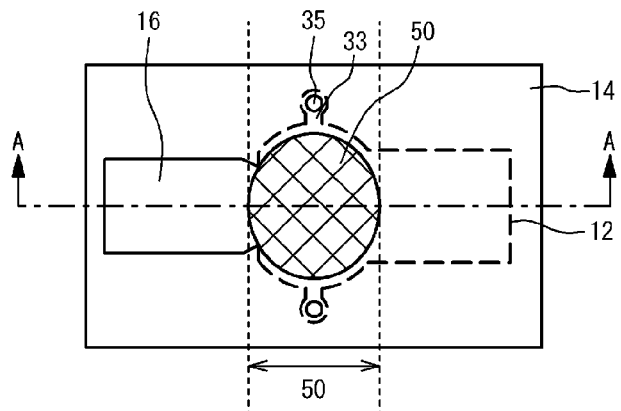
FIG. 1A illustrates a plane view of a piezoelectric thin film resonator in accordance with a first embodiment.
Figure 1B:
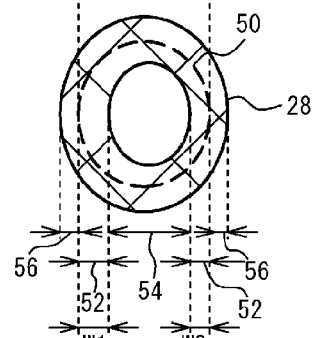
FIG. 1B illustrates a plane view of an inserted film.
Figure 1C:
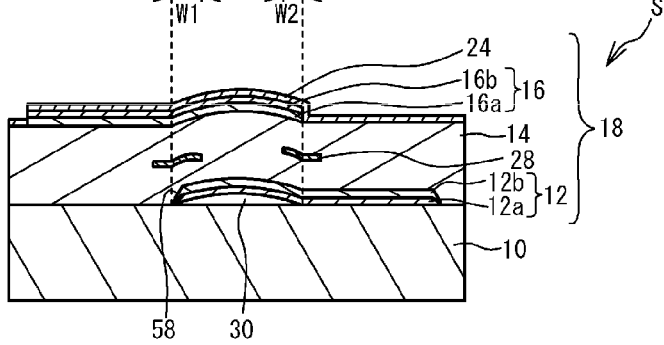
FIG. 1C and FIG. 1D illustrate a cross sectional view taken along a line A-A of FIG. 1A.
Figure 1D:
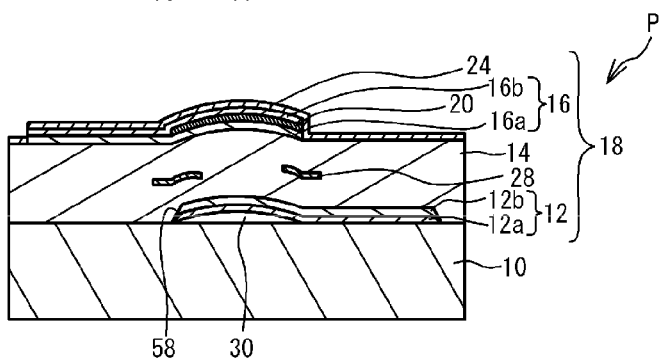

FIG. 1A illustrates a plane view of a piezoelectric thin film resonator in accordance with a first embodiment. FIG. 1B illustrates a plane view of an inserted film. FIG. 1C and FIG. 1D illustrate a cross sectional view taken along a line A-A of FIG. 1A. FIG. 1C illustrates a cross sectional view of a series resonator of a ladder type filter. FIG. 1D illustrates a cross sectional view of a parallel resonator of a ladder type filter.

With reference to FIG. 1A and FIG. 1C, a description will be given of a structure of a series resonator S. A lower electrode 12 is provided on a substrate 10 that is a silicon (Si) substrate. A cavity 30 having a dome-shaped bulge is formed between a flat main face of the substrate 10 and the lower electrode 12. The dome-shaped bulge is a bulge in which a height of the cavity 30 is smaller around the cavity 30 and the height of the cavity 30 is larger inside of the cavity 30. The lower electrode 12 has a lower layer 12a and an upper layer 12b. The lower layer 12a is, for example, a Cr (chrome) film. The upper layer 12b is, for example, a Ru (ruthenium) film. An edge face 58 of the lower electrode 12 has a taper shape in which a lower face of the lower electrode 12 is larger than an upper face of the lower electrode 12.

A piezoelectric film 14 of which main component is aluminum nitride (AlN) having a main axis of (002) direction is provided on the lower electrode 12. An inserted film 28 is provided in the piezoelectric film 14. The inserted film 28 is approximately provided at a center of the piezoelectric film 14 in a film thickness direction. The inserted film 28 may be provided in a region other than the center. However, when the inserted film 28 is provided at the center of the piezoelectric film 14, the function of the inserted film is enhanced. An upper electrode 16 is provided on the piezoelectric film 14 so that a region (resonance region 50) in which the lower electrode 12 and the upper electrode 16 sandwich the piezoelectric film 14 and face with each other is formed. The resonance region 50 has an ellipse shape and is a region in which an acoustic wave of a thickness longitudinal oscillation mode resonates. The upper electrode 16 has a lower layer 16a and an upper layer 16b. The lower layer 16a is, for example, a Ru film. The upper layer 16b is, for example, a Cr film.

A silicon oxide film acting as a frequency adjusting film 24 is formed on the upper electrode 16. A lamination film 18 in the resonance region 50 has the lower electrode 12, the piezoelectric film 14, the inserted film 28, the upper electrode 16 and the frequency adjusting film 24. The frequency adjusting film 24 may act as a passivation film.

As illustrated in FIG. 1A, a guide path 33 for performing an etching to a sacrifice layer is formed in the lower electrode 12. The sacrifice layer is a layer for forming the cavity 30. A region around an edge of the guide path 33 is not covered by the piezoelectric film 14. The lower electrode 12 has a hole portion 35 at an edge of the guide path 33.

With reference to FIG. 1A and FIG. 1D, a description will be given of a structure of the parallel resonator P. The parallel resonator P is different from the series resonator S in a point that a mass load film 20 is provided between the lower layer 16a and the upper layer 16b of the upper electrode 16. The mass load film 20 is, for example, a Ti (titanium) film. Therefore, the lamination film 18 includes the mass load film 20 formed on a whole face in the resonance region 50 in addition to the lamination film of the series resonator S. Other structures are the same as FIG. 1C of the series resonator S. Therefore, an explanation of the structures is omitted.

A resonance frequency difference between the series resonator S and the parallel resonator P is adjusted with use of a film thickness of the mass load film 20. The resonance frequency of both the series resonator S and the parallel resonator P is adjusted by adjusting the film thickness of the frequency adjusting film 24.

In a case of a piezoelectric thin film resonator having a resonance frequency of 2 GHz, the lower layer 12a of the lower electrode 12 is a Cr film. A thickness of the lower layer 12a is 100 nm. The upper layer 12b of the lower electrode 12 is a Ru film. A thickness of the upper layer 12b is 250 nm. The piezoelectric film 14 is an AlN film. A thickness of the piezoelectric film 14 is 1100 nm. The inserted film 28 is a silicon oxide ($SiO_2$) film. A thickness of the inserted film 28 is 150 nm. The lower layer 16a of the upper electrode 16 is a Ru film. A thickness of the lower layer 16a is 250 nm. The upper layer 16b of the upper electrode 16 is a Cr film. A thickness of the upper layer 16b is 50 nm. The frequency adjusting film 24 is a silicon oxide film. A thickness of the frequency adjusting film 24 is 50 nm. The mass load film 20 is a Ti film. A thickness of the mass load film 20 is 120 nm. The film thickness of each layer may be arbitrarily set to achieve a desirable resonance characteristic.

As illustrated in FIG. 1B, the inserted film 28 is provided in an outer circumference region 52 of the resonance region 50 but is not provided in a center region 54. The outer circumference region 52 is a region in the resonance region 50, includes the outer circumference of the resonance region 50 and is along with the outer circumference of the resonance region 50. The outer circumference region 52 has a stripe shape or a ring shape. The center region 54 is a region in the resonance region 50 and is a region including a center of the resonance region 50. The center may be a position other than a geometric center. The inserted film 28 is provided in a region 56 surrounding the resonance region 50 in addition to the outer circumference region 52. The inserted film 28 may be continuously provided from the outer circumference region 52 to outside of the resonance region 50.

Figure 2A:
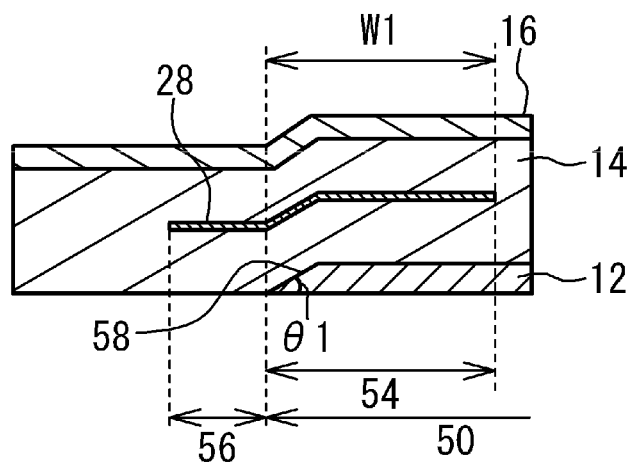
FIG. 2A and FIG. 2B illustrate an enlarged cross sectional view around an edge of a resonance region.
Figure 2B:
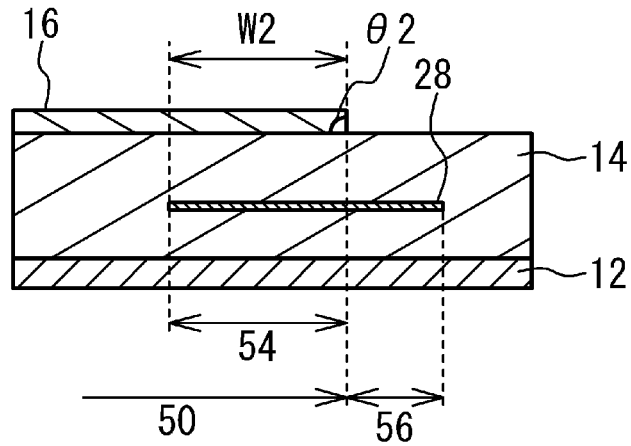

FIG. 2A and FIG. 2B illustrate an enlarged cross sectional view around an edge of the resonance region. The upper electrode 16 is extracted from the resonance region 50 to a left side. The lower electrode 12 is extracted from the resonance region to a right side. FIG. 2A illustrates an enlarged view of an edge of the resonance region 50 on the side to which the upper electrode 16 is extracted. FIG. 2B illustrates an enlarged view of an edge of the resonance region 50 on the side to which the lower electrode 12 is extracted.

As illustrated in FIG. 2A, the edge face 58 of the lower electrode 12 has a taper shape in which an angle θ1 between the edge face 58 and the lower face of the lower electrode 12 is a sharp angle. This is because when the piezoelectric film 14 is formed on the lower electrode and the substrate 10 in a case where the angle θ1 is equal to or more than 90 degrees, the film characteristic of the piezoelectric film 14 on the edge face 58 may be degraded. In order to suppress degradation of the film characteristic of the piezoelectric film 14, the angle θ1 is, for example, 60 degrees or less or is, for example, 45 degrees or less. The edge face 58 may have a shape other than a plane. The region of the edge face 58 of the lower electrode 12 contributes as the resonance region 50. That is, the region in which the lower electrode 12 is thin acts as the resonance region 50 in which an acoustic wave oscillates. A width of the inserted film 28 in the resonance region 50 is expressed as a width W1.

As illustrated in FIG. 2B, the edge face of the upper electrode 16 is approximately vertical to the substrate 10. That is, an angle θ2 between the edge face and the lower face of the upper electrode 16 is 90 degrees. The angle θ2 may be smaller than 90 degrees. Even if the angle θ2 of the upper electrode 16 is large, there is little influence on the piezoelectric film 14. Therefore, the angle θ2 of the edge face of the upper electrode 16 is large so that a processing gets easier. Therefore, the angle θ2 is larger than the angle θ1. A width of the inserted film 28 in the resonance region 50 is expressed as a width W2.

A quartz substrate, a glass substrate, a ceramics substrate, a GaAs substrate or the like other than the Si substrate may be used as the substrate 10. A single layer film or a lamination film of Al (aluminum), Ti, Cu (copper), Mo (molybdenum), W (tungsten), Ta (tantalum), Pt (platinum), Rh (rhodium), Jr (iridium) or the like other than Ru and Cr may be used as the lower electrode 12 and the upper electrode 16. For example, the lower layer 16a of the upper electrode 16 may be Ru. The upper layer 16b of the upper electrode 16 may be Mo. ZnO (zinc oxide), PZT (lead zirconate titanate), $PbTiO_3$ (lead titanate) or the like other than the aluminum nitride may be used as the piezoelectric film 14. For example, the piezoelectric film 14 may have aluminum nitride as a main component and may include another element for improving resonance characteristic or improving piezoelectricity. For example, when Sc (scandium) is used as a dopant element, the piezoelectricity of the piezoelectric film 14 is improved. It is therefore possible to improve an effective electromechanical coupling coefficient of the piezoelectric thin film resonator.

It is preferable that the inserted film 28 may be made of a material having a Young's modulus smaller than that of the piezoelectric film 14 such as Al, Au, Cu, Ti, Pt, Ta, Cr or $SiO_2$. Thus, a Q value may be improved. When a metal film is used as the inserted film 28, an effective electromechanical coupling coefficient may be improved. Details will be described later.

A silicon nitride film, an aluminum nitride film or the like other than the silicon oxide film may be used as the frequency adjusting film 24. A single-layer film such as Ru, Cr, Al, Cu, Mo, W, Ta, Pt, Rh, Jr or the like other than Ti may be used as the mass load film 20. For example, an insulating film made of a nitride metal or an oxide metal such as silicon nitride or silicon oxide may be used. The mass load film 20 may be formed under the lower electrode 12, between layers of the lower electrode 12, on the upper electrode 16, between the lower electrode 12 and the piezoelectric film 14 or between the piezoelectric film 14 and the upper electrode 16. The mass load film 20 may be larger than the resonance region 50 when the mass load film 20 includes the resonance region 50.

Figure 3A:
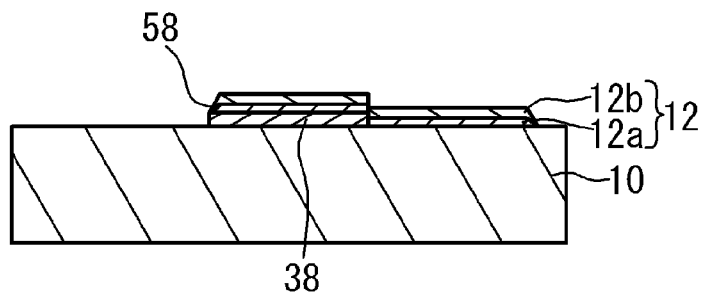
FIG. 3A to FIG. 3C illustrate a cross sectional view for describing a manufacturing method of a series resonator in accordance with a first embodiment.
Figure 3B:
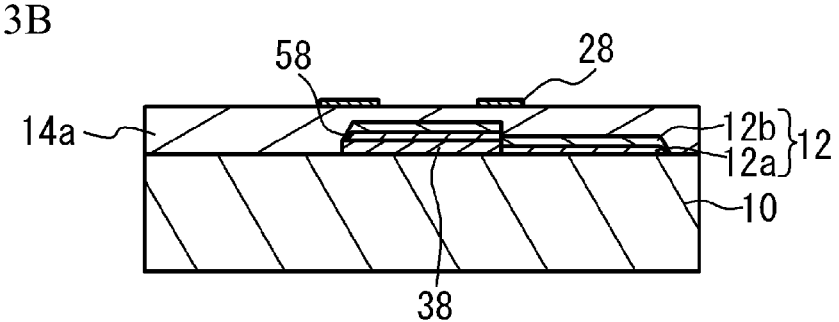
Figure 3C:
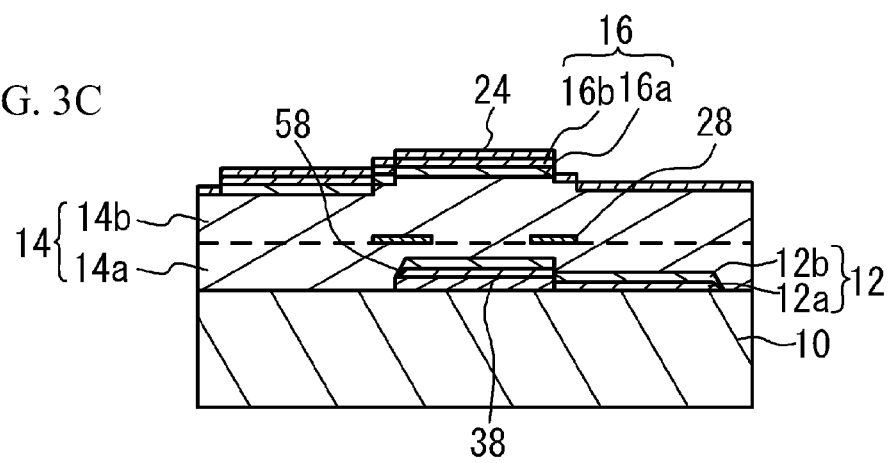

FIG. 3A to FIG. 3C illustrate a cross sectional view for describing a manufacturing method of the series resonator in accordance with the first embodiment. As illustrated in FIG. 3A, a sacrifice layer 38 for forming a cavity on the substrate 10 having a flat main face is formed. A thickness of the sacrifice layer 38 is, for example, 10 to 100 nm. The material of the sacrifice layer 38 is selected from materials that easily dissolved in etching liquid or etching gas such as MgO, ZnO, Ge or $SiO_2$. After that, the sacrifice layer 38 is subjected to a patterning with use of a photolithography technology and an etching technology and is formed into a desirable shape. The shape of the sacrifice layer 38 corresponds to the plane shape of the cavity 30. And the sacrifice layer 38 includes a region to be the resonance region 50. Next, the lower layer 12a and the upper layer 12b are formed on the sacrifice layer 38 and the substrate 10 as the lower electrode 12. The sacrifice layer 38 and the lower electrode 12 are, for example, formed with use of a sputtering method, a vacuum vapor deposition method or a CVD (Chemical Vapor Deposition) method. After that, the lower electrode 12 is subjected to a patterning with use of a photolithography technology and an etching technology and is formed into a desirable shape. The lower electrode 12 may be formed by a lift-off method. In this case, a patterning is performed so that the edge face 58 of the lower electrode 12 is formed into a taper shape.

As illustrated in FIG. 3B, a piezoelectric film 14a and the inserted film 28 are formed on the lower electrode 12 and the substrate 10 with use of a sputtering method, a vacuum vapor deposition method, a CVD method or the like. The inserted film 28 is subjected to a patterning with use of a photolithography technology and an etching technology and is formed into a desirable shape. The inserted film 28 may be formed by a lift-off method.

As illustrated in FIG. 3C, a piezoelectric film 14b, the lower layer 16a and the upper layer 16b of the upper electrode 16 are formed with use of a sputtering method, a vacuum vapor deposition method or a CVD method. The piezoelectric film 14 is formed from the piezoelectric films 14a and 14b. The upper electrode 16 is subjected to a patterning with use of a photolithography technology and an etching technology and is formed in to a desirable shape. The upper electrode 16 may be formed by a lift-off method.

In the parallel resonator illustrated in FIG. 1D, after forming the lower layer 16a, the mass load film 20 is formed by a sputtering method, a vacuum vapor deposition method, a CVD method or the like. The mass load film 20 is subjected to a patterning with use of a photolithography technology and an etching technology and is formed into a desirable shape. After that, the upper layer 16b is formed.

The frequency adjusting film 24 is formed by a sputtering method, a CVD method or the like. The frequency adjusting film 24 is subjected to a patterning with use of a photolithography technology and an etching technology and is formed into a desirable shape.

After that, the etching liquid of the sacrifice layer 38 is guided to the sacrifice layer 38 under the lower electrode 12 via the hole portion 35 and the guide path 33 (with reference to FIG. 1A). Thus, the sacrifice layer 38 is removed. It is preferable that a medium for etching of the sacrifice layer 38 is a medium that does not etch materials of the resonator other than the sacrifice layer 38. In particular, it is preferable that the etching medium is a medium so that the lower electrode 12 contacting the etching medium is not etched. A stress of the lamination film 18 (with reference to FIG. 1C and FIG. 1D) is set to be a compression stress. Thus, when the sacrifice layer 38 is removed, the lamination film 18 expands so as to get away from the substrate 10 toward an opposite side of the substrate 10. The cavity 30 having a dome-shaped bulge between the lower electrode 12 and the substrate 10 is formed. With the processes, the series resonator S illustrated in FIG. 1A and FIG. 1C and the parallel resonator P illustrated in FIG. 1A and FIG. 1D are formed.

Figure 4A:
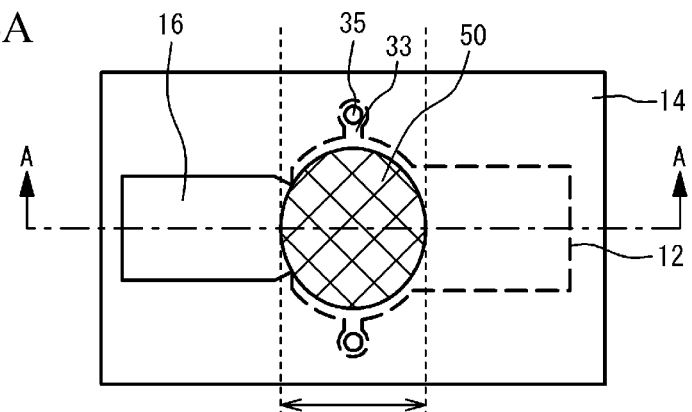
FIG. 4A illustrates a plane view of a piezoelectric thin film resonator in accordance with a first comparative example.
Figure 4B:
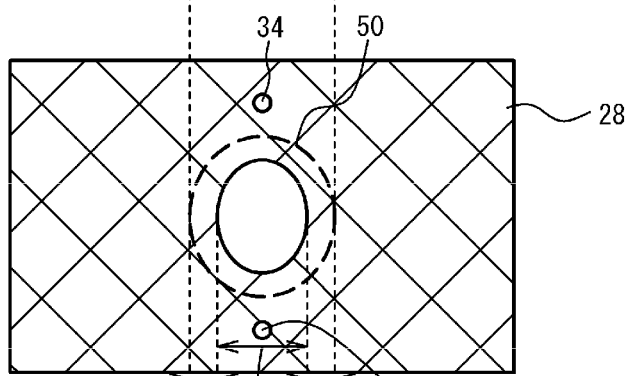
FIG. 4B illustrates a plane view of an inserted film.
Figure 4C:
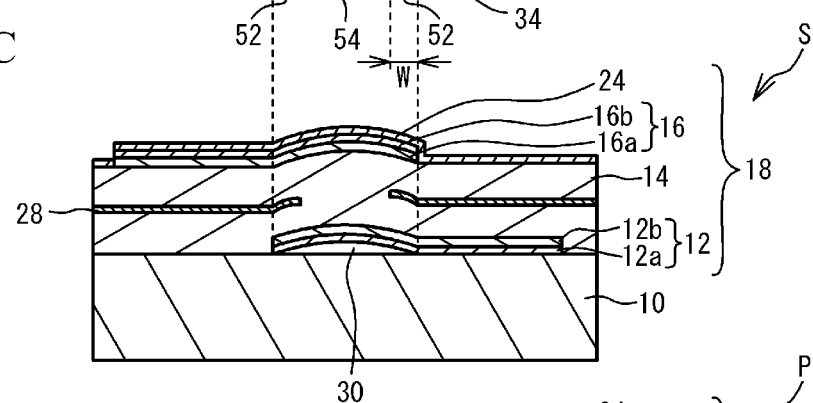
FIG. 4C and FIG. 4D illustrate a cross sectional view taken along a line A-A of FIG. 4A.
Figure 4D:
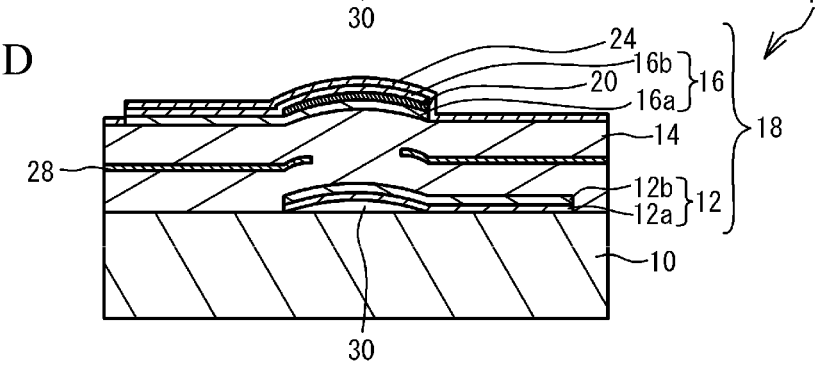

The effect of the inserted film 28 is studied in a first comparative example in which the edge face of the lower electrode 12 is approximately vertical to the lower face, and the width of the inserted film 28 in the resonance region 50 is approximately constant. FIG. 4A illustrates a plane view of a piezoelectric thin film resonator in accordance with the first comparative example. FIG. 4B illustrates a plane view of the inserted film. FIG. 4C and FIG. 4D illustrate a cross sectional view taken along a line A-A of FIG. 4A.

As illustrated in FIG. 4A to FIG. 4D, the edge face of the inserted film 28 is vertical to the lower face of the inserted film 28. The inserted film 28 is continuously formed toward outside of the resonance region 50. The width W of the inserted film 28 in the resonance region 50 is constant. Other structures are the same as FIG. 1A to FIG. 1D of the first embodiment. Therefore, an explanation of the structures is omitted.

In the first comparative example, the material of the inserted film 28 is changed, and the Q value of the anti-resonance point is simulated with use of a finite element method. The finite element method is performed by two-dimensional analysis of a cross section as illustrated in FIG. 4C. Each thickness and each material of the lamination film 18 are illustrated as the piezoelectric thin film resonator having a resonance frequency of 2 GHz of FIG. 1A to FIG. 1D. That is, the piezoelectric film 14 is made of AlN. The thickness of the inserted film 28 is 150 nm. The width W in which the resonance region 50 and the inserted film 28 overlap with each other is 2 μm. The inserted film 28 is provided in a center position of the piezoelectric film 14 in the film thickness direction.

Figure 5A:
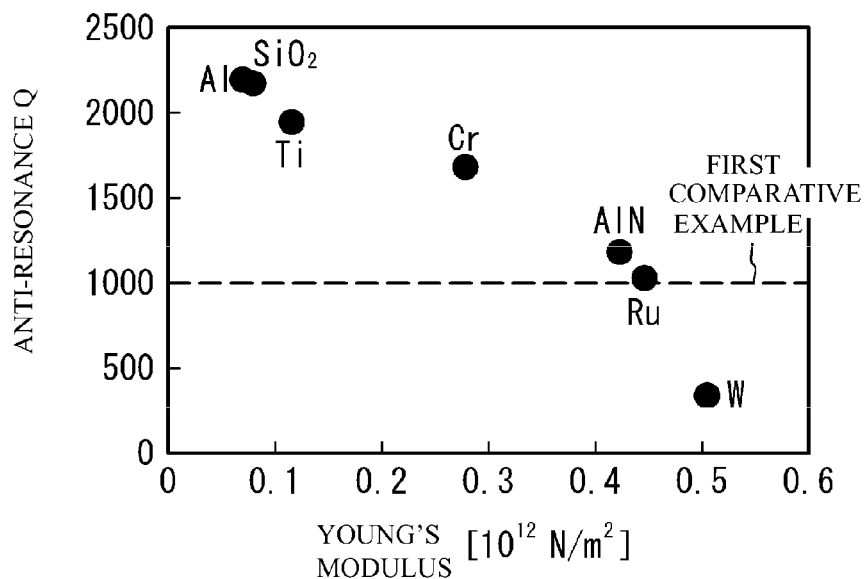
FIG. 5A illustrates a Q value of an anti-resonance point with respect to Young's modulus.
Figure 5B:
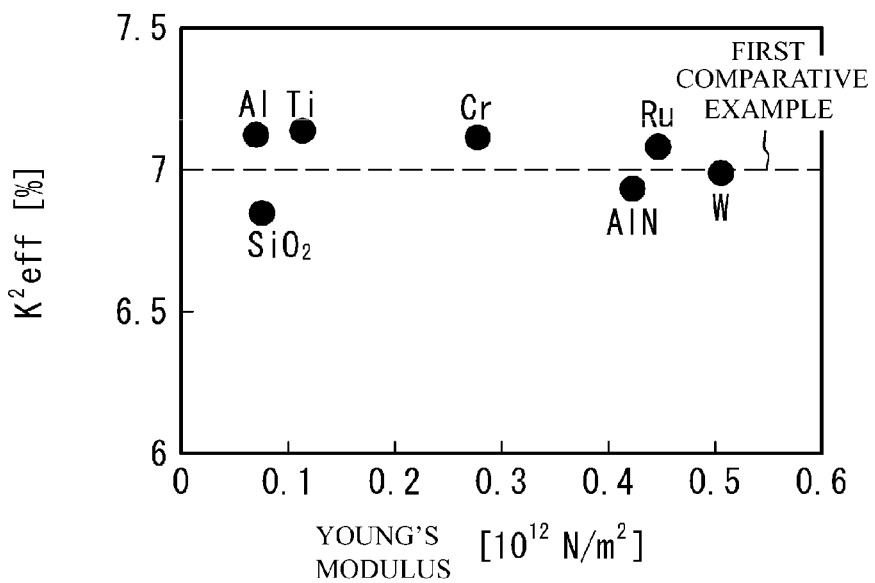
FIG. 5B illustrates an effective electromechanical coupling coefficient $k^2_{eff}$ with respect to Young's modulus.

FIG. 5A illustrates a Q value of an anti-resonance point with respect to the Young's modulus. FIG. 5B illustrates the effective electromechanical coupling coefficient k²eff with respect to the Young's modulus. A second comparative example corresponds to a resonator that does not have the inserted film 28. A calculation is performed with respect to Al, $SiO_2$, Ti, Cr, AlN, Ru and W as the material of the inserted film 28.

As illustrated in FIG. 5A, when a material having a small Young's modulus is used for the inserted film 28, the Q value of the anti-resonance point gets higher. When the Young's modulus is smaller than that of AlN, the Q value is higher than the first comparative example. This is because of the following reason. That is, when the inserted film 28 having a small Young's modulus is provided in the outer circumference region 52, an oscillation of an acoustic wave is small in the outer circumference region 52 of the resonance region 50. Thus, the outer circumference of the resonance region 50 acts as a fixed end, and an acoustic wave is fixed-end-reflected at the fixed end. Therefore, a leakage of acoustic wave energy toward outside of the resonance region 50 is suppressed. Thus, the Q value gets higher. It is preferable that the Young's modulus of the inserted film 28 is smaller than the Young's modulus of the piezoelectric film 14. It is preferable that the Young's modulus of the inserted film 28 is equal to or less than 90% of the Young's modulus of the piezoelectric film 14. It is more preferable that the Young's modulus of the inserted film 28 is equal to or less than 80% of the Young's modulus of the piezoelectric film 14.

As illustrated in FIG. 5B, the effective electromechanical coupling coefficient k²eff gets higher when the inserted film 28 is made of metal. It is estimated that a distribution of electrical field of an acoustic wave in the resonance region 50 is equalized when the inserted film 28 is made of metal.

Next, the width W1 and the width W2 of FIG. 2A and FIG. 2B are changed. And, the Q value of the anti-resonance point is simulated with use of the finite element method. The finite element method is performed by the two-dimensional analysis of the cross section as illustrated in FIG. 2A and FIG. 2B. The resonance region 50 has a mirror symmetry structure. That is, the both sides of the resonance region 50 have the structure illustrated in FIG. 2A. The width W1 is changed. And, the Q value is calculated. Similarly, the both sides of the resonance region 50 have the structure illustrated in FIG. 2B. The width W2 is changed. And the Q value is calculated. Each thickness and each material of the lamination film 18 are the same as the piezoelectric thin film resonator having the resonance frequency of 2 GHz illustrated in FIG. 1A to FIG. 1D. That is, the inserted film 28 is a silicon oxide film. The thickness of the inserted film 28 is 150 nm. The angle θ1 is 30 degrees. The angle θ2 is 90 degrees.

Figure 6A:
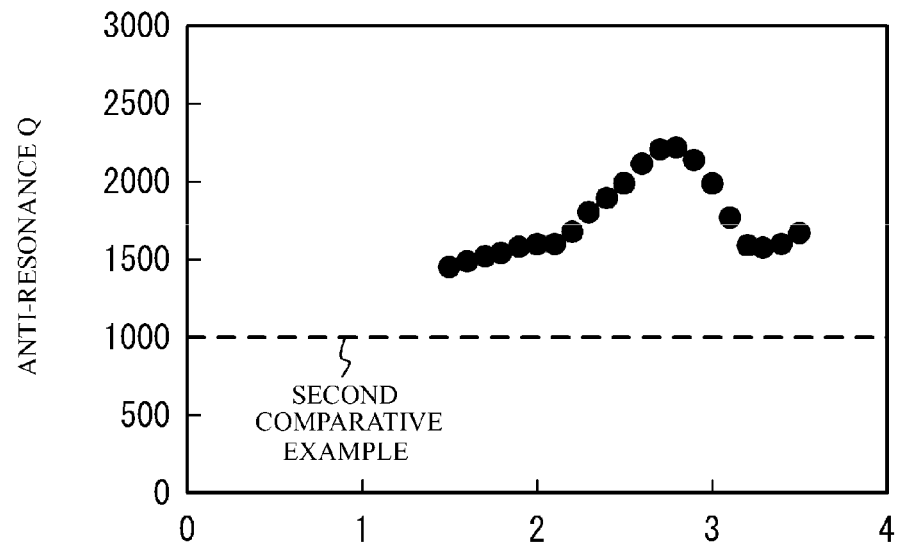
FIG. 6A and FIG. 6B respectively illustrate a Q value at an anti-resonance point with respect to widths W1 and W2 of an inserted film.
Figure 6B:
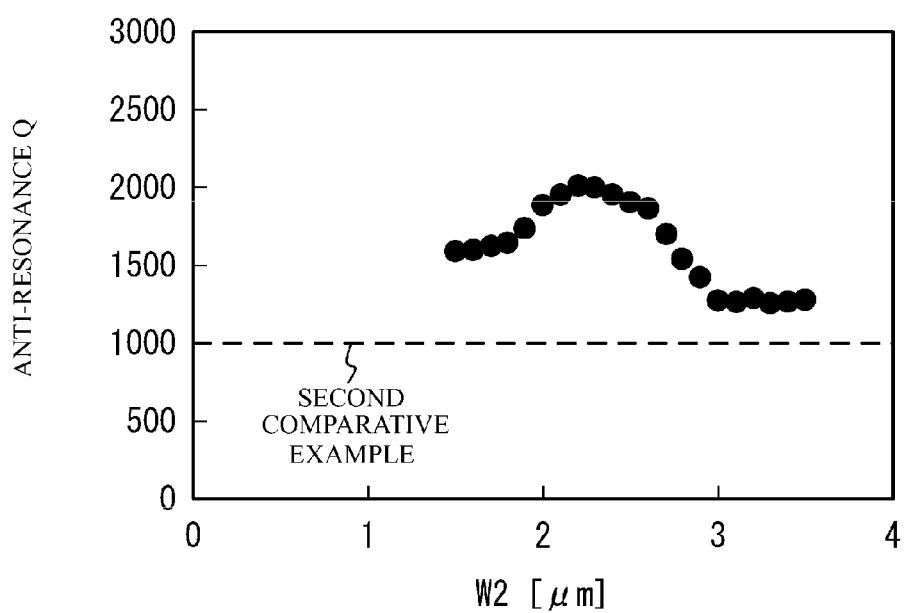

FIG. 6A and FIG. 6B respectively illustrate the Q value at the anti-resonance point with respect to the widths W1 and W2 of the inserted film. A broken line indicates the second comparative example that does not have the inserted film 28. As illustrated in FIG. 6A and FIG. 6B, when the inserted film 28 is provided, the Q value may be improved. As illustrated in FIG. 6A, when the width W1 is approximately 2.7 μm, the Q value is a maximum. As illustrated in FIG. 6B, when the width W2 is approximately 2.4 μm, the Q value is a maximum. "W2−W1" is approximately 0.3 μm. The length in the face direction of the taper region of the inserted film 28 is (the thickness of the inserted film 28=0.15 nm)×cot (θ1=30 degrees)=0.26 μm. In this manner, the difference between the widths W2 and W1 achieving the maximum of the Q value approximately corresponds to the length in the face direction of the edge face 58. It is thought this is because the region of the lower electrode 12 of which edge face has a taper shape acts as the resonance region 50 but does not act as the inserted film 28. In particular, when the angle θ1 of the edge face 58 of the lower electrode 12 is sharp angle, the inserted film 28 of the region of the edge face 58 has a small function of reflecting an acoustic wave.

In the first embodiment, the edge face 58 of the lower electrode 12 has a taper shape in which the lower face of the lower electrode 12 is larger than the upper face of the lower electrode 12. Thus, the film characteristic of the piezoelectric film 14 may be improved. However, the edge face 58 of the lower electrode 12 has the taper shape. Therefore, the region acting as the inserted film 28 is narrowed. And so, the first width W1 of the inserted film 28 in the resonance region 50 on the side in which the upper electrode 16 is extracted from the resonance region 50 is larger than the second width W2 of the inserted film 28 of the resonance region 50 on the side in which the lower electrode 12 is extracted from the resonance region 50. Thus, the width W1 of the inserted film 28 on the extraction side of the upper electrode 16 and the width W2 of the inserted film 28 on the extraction side of the lower electrode 12 are optimized. Therefore, the leakage of an acoustic wave toward outside of the resonance region 50 can be suppressed, and the Q value can be improved.

The angle θ1 is reduced in order to improve the film characteristic of the piezoelectric film 14. The angle θ2 is enlarged in order to process the upper electrode 16 easily. That is, the angle θ1 between the edge face of the lower electrode 12 and the upper face of the substrate 10 is smaller than the angle θ2 between the edge face of the upper electrode 16 and the upper face of the substrate 10. In this case, when the width W1 is larger than the width W2, the Q value can be improved.

It is preferable that a difference between the first width W1 and the second width W2 is a length corresponding to the taper (that is, a length of the edge face 58 in the face direction). Thereby, as described in FIG. 6A and FIG. 6B, the Q value may be improved.

Figure 7A:
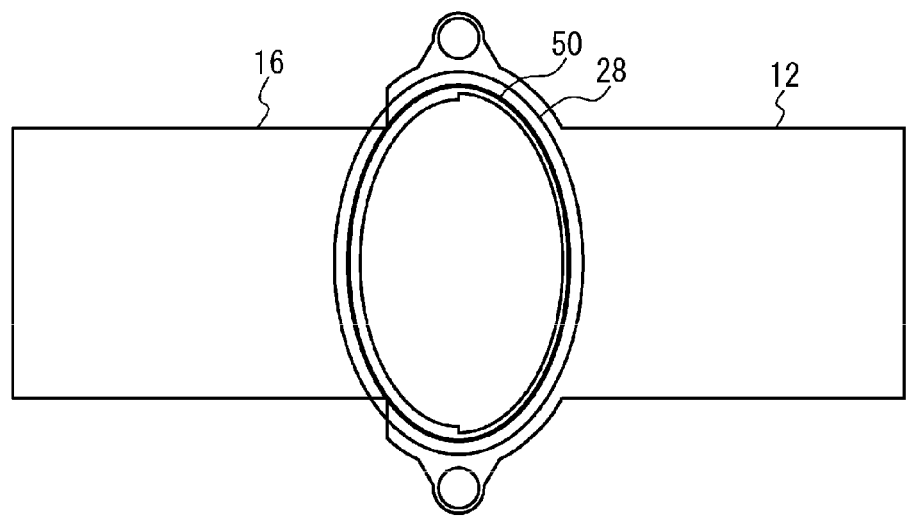
FIG. 7A and FIG. 7B illustrate a plane view around an inserted film that is an example of a shape of an inserted film of a first embodiment.
Figure 7B:
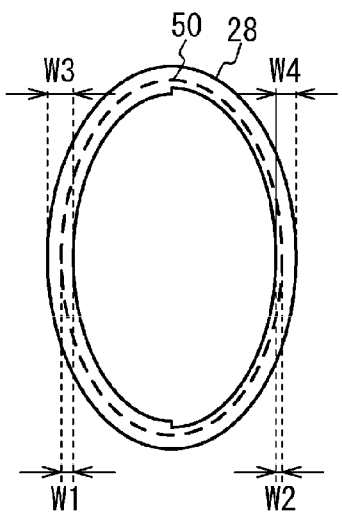

FIG. 7A and FIG. 7B illustrate a plane view around the inserted film that is an example of the shape of the inserted film of the first embodiment. The scaling of FIG. 7A and FIG. 7B is different from that of FIG. 1A and FIG. 1B in order to approximate the scaling of FIG. 7A and FIG. 7B to an actual scaling. The same goes for FIG. 8A to FIG. 9B. As illustrated in FIG. 7A, the resonance region 50 is a region in which the upper electrode 16 overlaps with the lower electrode 12. The lower electrode 12 and the upper electrode 16 are provided so that the resonance region 50 has an ellipse shape. As illustrated in FIG. 7B, the outer circumference of the inserted film 28 has an ellipse shape. An inner circumference of the inserted film 28 has an ellipse shape in which the extraction side of the upper electrode 16 is different from the extraction side of the lower electrode 12. With respect to the width of the inserted film 28, the width W3 of the extraction side of the upper electrode 16 is larger than the width W4 of the extraction side of the lower electrode 12. Thus, the width W1 is larger than the width W2.

Figure 8A:
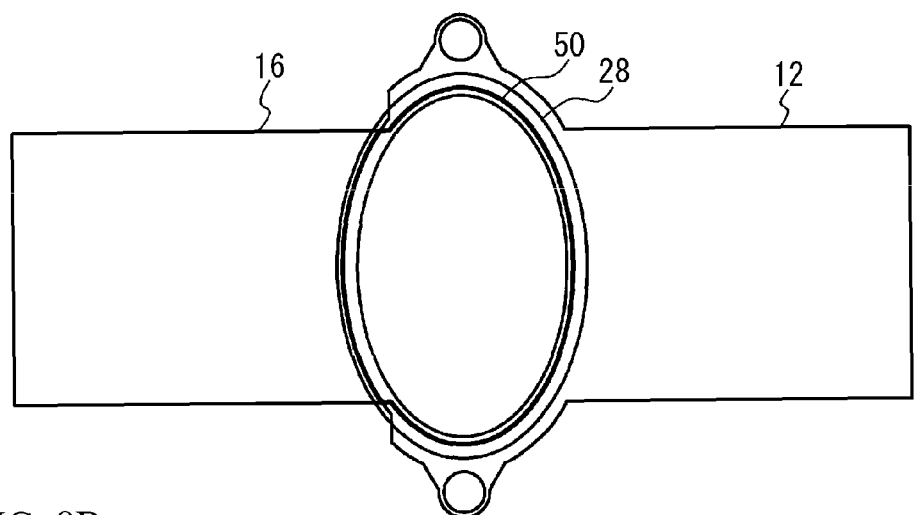
FIG. 8A and FIG. 8B illustrate a plane view around an inserted film that is an example of a shape of an inserted film of a first embodiment.
Figure 8B:
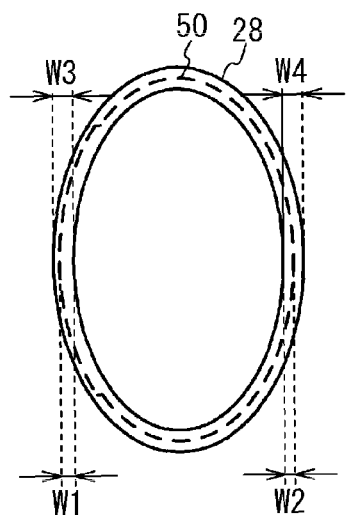

FIG. 8A and FIG. 8B illustrate a plane view around the inserted film as an example of the shape of the inserted film of the first embodiment. As illustrated in FIG. 8A, the shape of the resonance region 50 is close to an ellipse. However, the resonance region 50 projects to the extraction side of the upper electrode 16. As illustrated in FIG. 8B, the outer circumference and the inner circumference of the inserted film 28 have an ellipse shape. The inner circumference of the inserted film is approximately consistent with the outer circumference of the inserted film. Thus, with respect to the width of the inserted film 28 having a ring shape, the width W3 on the extraction side of the upper electrode 16 is the same as the width W4 on the extraction side of the lower electrode 12. However, the resonance region 50 projects toward the extraction side of the upper electrode 16. Therefore, the width W1 is larger than the width W2.

In this manner, the inserted film 28 may be asymmetric with respect to a long axis, and the width W3 may differ from the width W4. Thereby, the width W1 may differ from the width W2. The shape of the resonance region 50 may be asymmetric with respect to the long axis. Thereby, the width W1 may differ from the width W2. Both the inserted film 28 and the resonance region 50 may be asymmetric with respect to the long axis. Thereby, the width W1 may be differ from the width W2.

Figure 9A:
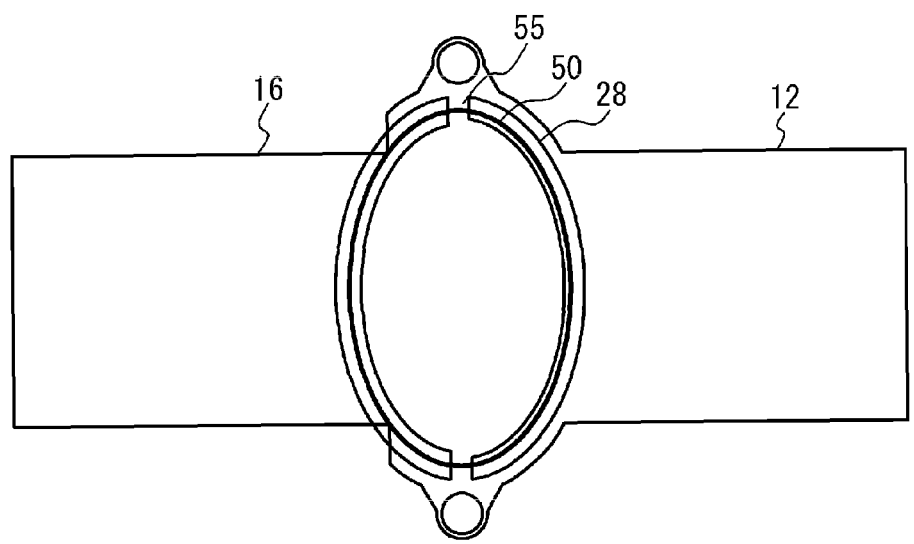
FIG. 9A and FIG. 9B illustrate a plane view around an inserted film that is an example of a shape of an inserted film of a first embodiment.
Figure 9B:
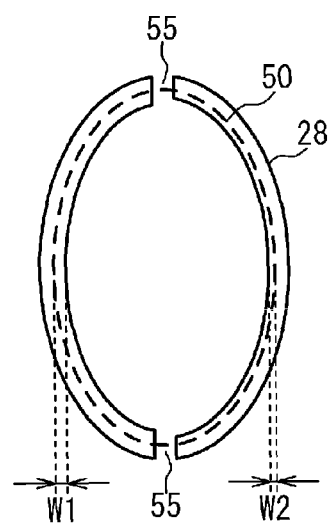

FIG. 9A and FIG. 9B illustrate a plane view around the inserted film as an example of the shape of the inserted film of the first embodiment. As illustrated in FIG. 9A and FIG. 9B, the inserted film 28 is divided into a plurality of regions. A space 55 may be formed between the regions. In this manner, the inserted film 28 may be divided into the plurality of regions.

Second Embodiment

Figure 10A:
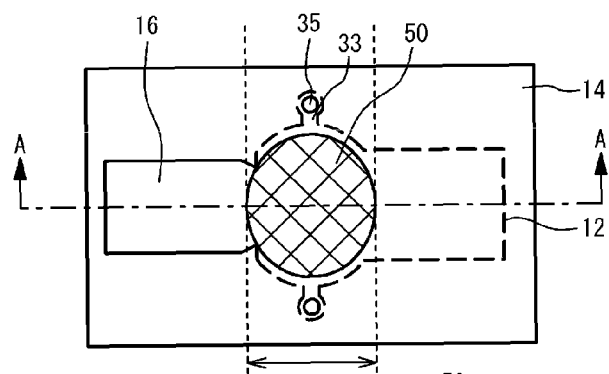
FIG. 10A illustrates a plane view of a piezoelectric thin film resonator in accordance with a second embodiment.
Figure 10B:
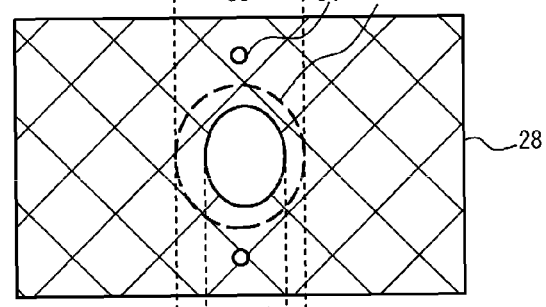
FIG. 10B illustrates a plane view of an inserted film.
Figure 10C:
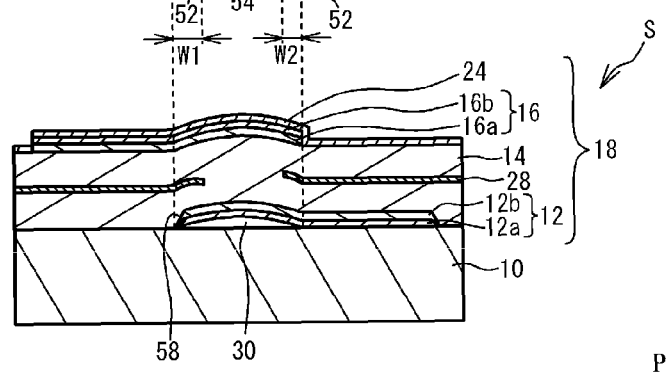
FIG. 10C and FIG. 10D illustrate a cross sectional view taken along a line A-A of FIG. 10A.
Figure 10D:
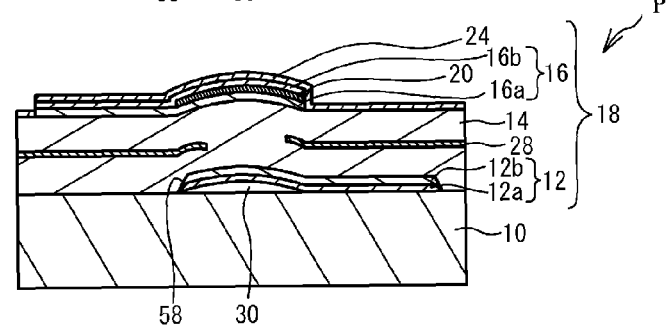

FIG. 10A illustrates a plane view of a piezoelectric thin film resonator in accordance with a second embodiment. FIG. 10B illustrates a plane view of an inserted film. FIG. 10C and FIG. 10D illustrate a cross sectional view taken along a line A-A of FIG. 10A. As illustrated in FIG. 10A to FIG. 10D, the inserted film 28 is formed continuously toward outside of the resonance region 50. Other structures are the same as FIG. 1A to FIG. 1D of the first embodiment. An explanation of the structures is omitted. As in the case of the second embodiment, the inserted film 28 may be formed on a whole face of the resonance region 50 except for the center region 54.

Third Embodiment

Figure 11A:
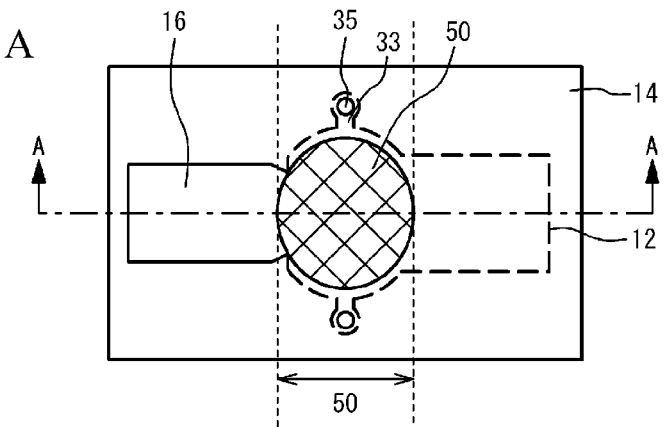
FIG. 11A illustrates a plane view of a piezoelectric thin film resonator in accordance with a third embodiment.
Figure 11B:
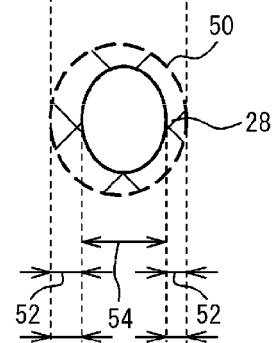
FIG. 11B illustrates a plane view of an inserted film.
Figure 11C:
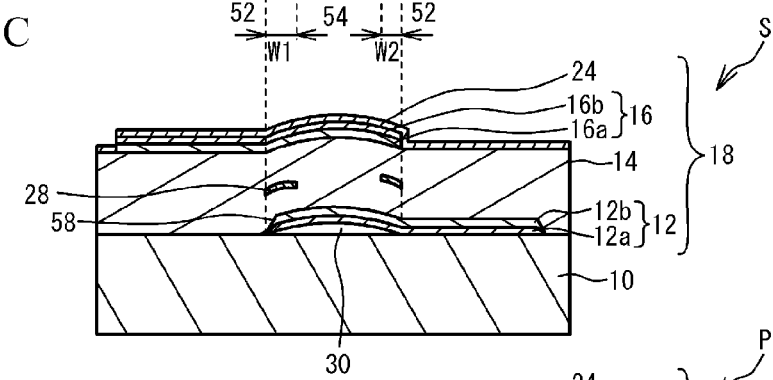
FIG. 11C and FIG. 11D illustrate a cross sectional view taken along a line A-A of FIG. 11A.
Figure 11D:
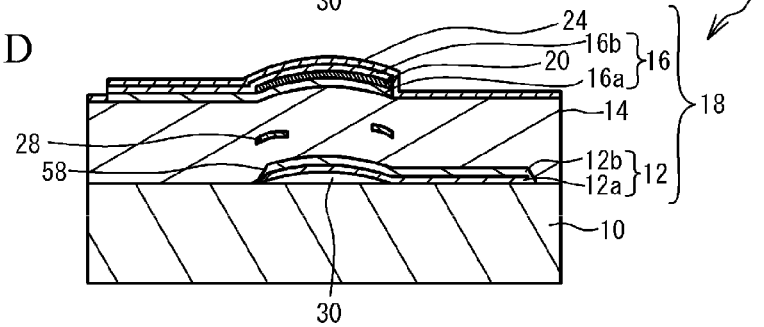

FIG. 11A illustrates a plane view of a piezoelectric thin film resonator in accordance with a third embodiment. FIG. 11B illustrates a plane view of an inserted film. FIG. 11C and FIG. 11D illustrate a cross sectional view taken along a line A-A of FIG. 11A. As illustrated in FIG. 11A to FIG. 11D, the inserted film 28 is not provided out of the resonance region 50. Other structures are the same as FIG. 1A to FIG. 1D of the first embodiment. An explanation of the structures is omitted. As in the case of the third embodiment, the inserted film 28 may be provided only in the resonance region 50.

Fourth Embodiment

Figure 12A:
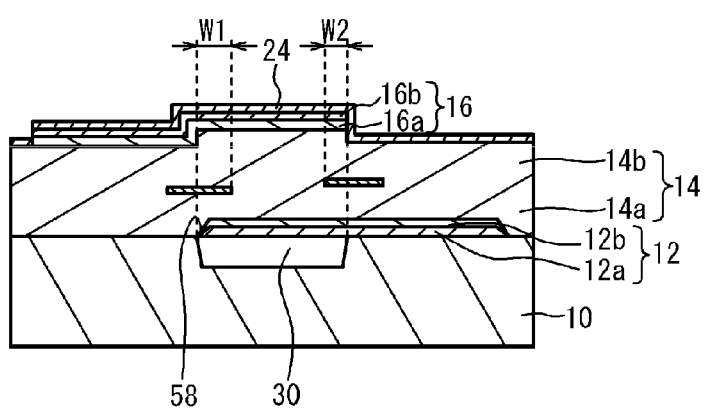
FIG. 12A illustrates a cross sectional view of a piezoelectric thin film resonator in accordance with a fourth embodiment.
Figure 12B:
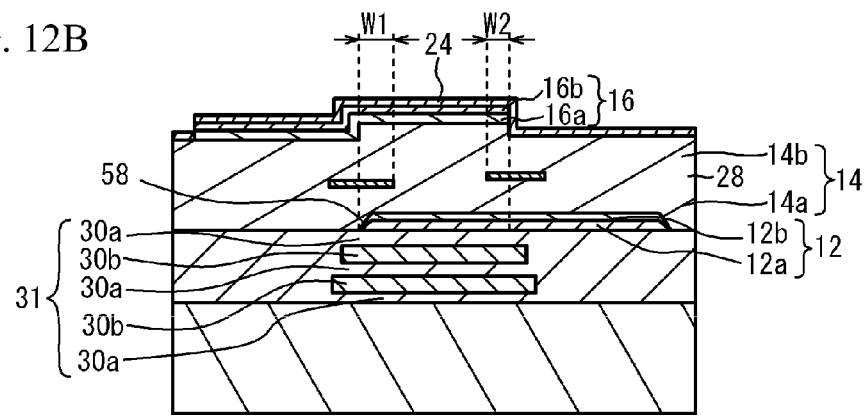
FIG. 12B illustrates a cross sectional view of a piezoelectric thin film resonator in accordance with a modified embodiment of a fourth embodiment.

A fourth embodiment is an embodiment in which the structure of the cavity is changed. FIG. 12A illustrates a cross sectional view of a piezoelectric thin film resonator in accordance with the fourth embodiment. FIG. 12B illustrates a cross sectional view of a piezoelectric thin film resonator in accordance with a modified embodiment of the fourth embodiment. As illustrated in FIG. 12A, the lamination film 18 of the resonance region 50 does not have the dome shape but has a flat shape. A bulge is formed on the upper face of the substrate 10. The lower electrode 12 has a flat shape on the substrate 10. Thus, the cavity 30 is formed in a recess of the substrate 10. The cavity 30 is formed so as to include the resonance region 50. Other structures are the same as the first embodiment. Therefore, an explanation of the structures is omitted. The cavity 30 may be formed so as to penetrate the substrate 10. An insulating film may contact the lower face of the lower electrode 12. That is, the cavity 30 may be formed between the substrate 10 and the insulating film contacting the lower electrode 12. The insulating film may be an aluminum nitride film.

As illustrated in FIG. 12B, the lamination film 18 of the resonance region 50 does not have the dome shape but has a flat shape. A sound reflecting film 31 is formed on the opposite side of the piezoelectric film 14 with respect to the lower electrode 12 of the resonance region 50. The sound reflecting film 31 has a structure in which a film 30a having low acoustic impedance and a film 30b having high acoustic impedance are alternately provided. A thickness of the film 30a and the film 30b is, for example, $\lambda/4$ ($\lambda$ is a wavelength of an acoustic wave). The lamination number of the film 30a and the film 30b can be arbitrarily set. Other structures are the same as the first embodiment. Therefore, an explanation of the structures is omitted.

In the fourth embodiment and the modified embodiment, the inserted film 28 may be provided out of the resonance region 50 as in the case of the second embodiment. And, as in the case of the third embodiment, the inserted film 28 may be provided only in the resonance region 50.

As in the cases of the first embodiment to the fourth embodiment, the piezoelectric thin film resonator may be an FBAR (Film Bulk Acoustic Resonator) in which the cavity 30 is formed between the substrate 10 and the lower electrode 12 in the resonance region 50. As in the case of the modified embodiment of the fourth embodiment, the piezoelectric thin film resonator may be an SMR (Solidly Mounted Resonator) in which the resonance region 50 has the sound reflecting film 31 that reflects an acoustic wave propagating in the piezoelectric film 14 under the lower electrode 12.

In the first embodiment to the fourth embodiment and the modified embodiment, a description is given of embodiments in which the resonance region 50 has an ellipse shape. However, the resonance region 50 may have another shape. For example, the resonance region 50 may have another polygonal shape such as a tetragon shape or a pentagon shape.

Fifth Embodiment

Figure 13:
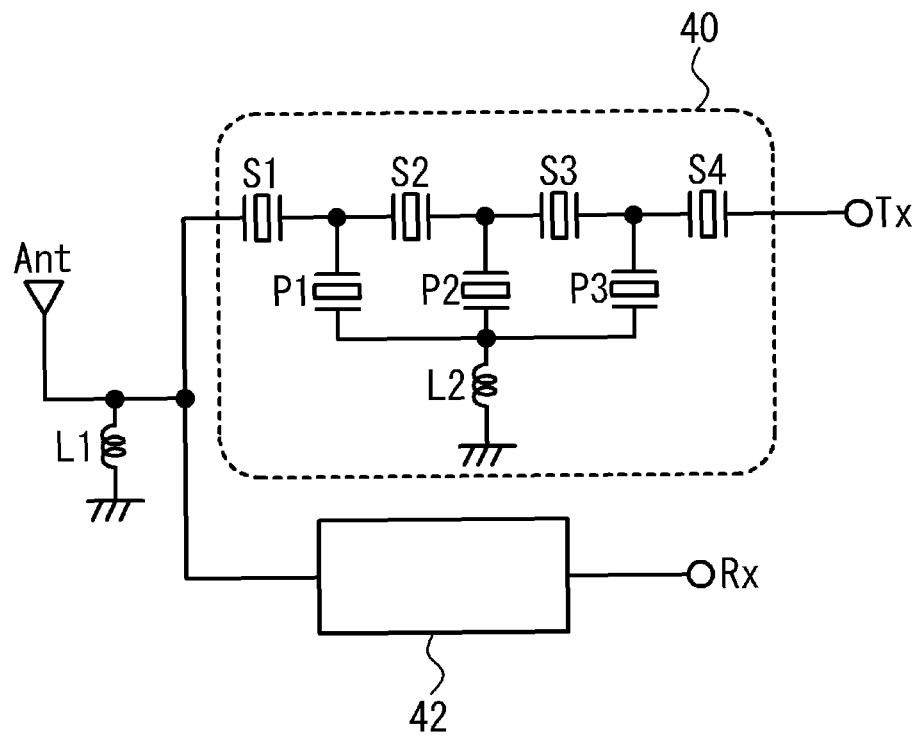
FIG. 13 illustrates a circuit diagram of a duplexer in accordance with a fifth embodiment.

A fifth embodiment is an embodiment of a duplexer. FIG. 13 illustrates a circuit diagram of a duplexer in accordance with the fifth embodiment. As illustrated in FIG. 13, the duplexer has a transmit filter 40 and a receive filter 42. The transmit filter 40 is connected between a common terminal Ant and a transmit terminal Tx. The receive filter 42 is connected between the common terminal Ant and a receive terminal Rx. An inductor L1 is provided between the common terminal Ant and a ground as a matching circuit. The transmit filter 40 transmits a signal having a transmit band of signals input from the transmit terminal Tx through the common terminal Ant as a transmit signal, and suppresses the signals having the other frequency. The receive filter 42 transmits a signal having a receive band of signals input from the common terminal Ant through the receive terminal Rx as a receive signal, and suppresses the signals having the other frequency. The inductor L1 performs an impedance matching so that the transmit signal passing through the transmit filter 40 is not leaked to the receive filter 42 and is output from the common terminal Ant.

The transmit filter 40 is a ladder type filter. One or more series resonators S1 to S4 are connected in series between the transmit terminal Tx (input terminal) and the common terminal Ant (output terminal). One or more parallel resonators P1 to P3 are connected in parallel between the transmit terminal Tx and the common terminal Ant. Ground sides of the parallel resonators P1 to P3 are grounded via the inductor L2 in common. The number or connection of the series resonators, the parallel resonators and the inductors can be arbitrarily changed in order to achieve desirable transmission characteristic. At least one of the series resonators S1 to S4 and the parallel resonators P1 to P3 may be one of the piezoelectric thin film resonators of the first embodiment to the fourth embodiment and the modified embodiment.

Figure 14A:
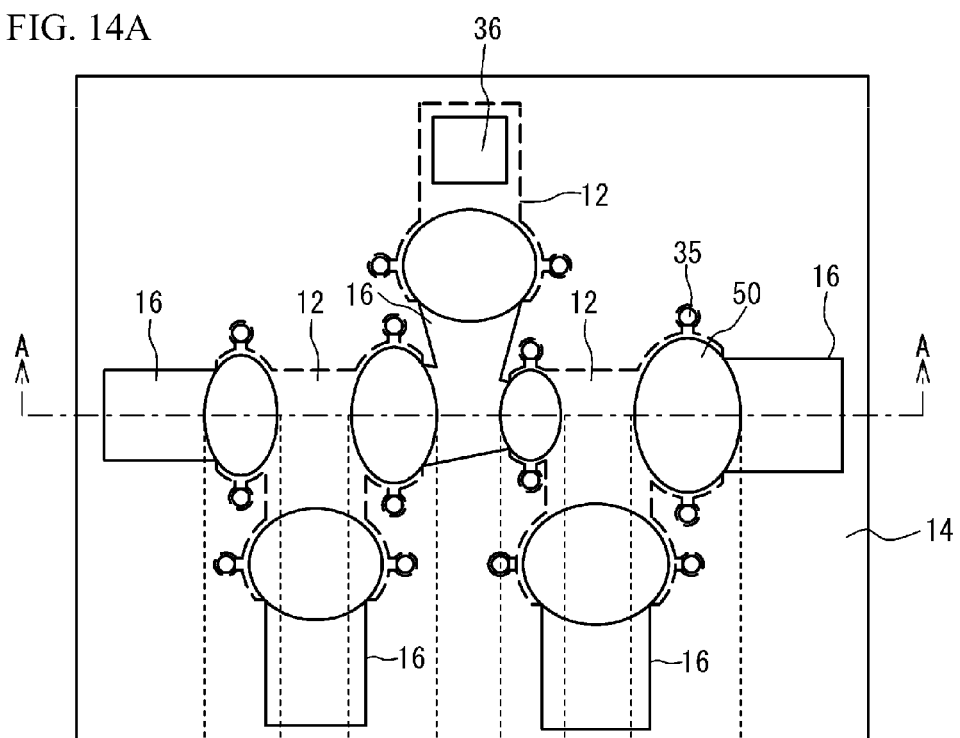
FIG. 14A illustrates a plane view and a cross sectional view of a transmission filter.
Figure 14B:
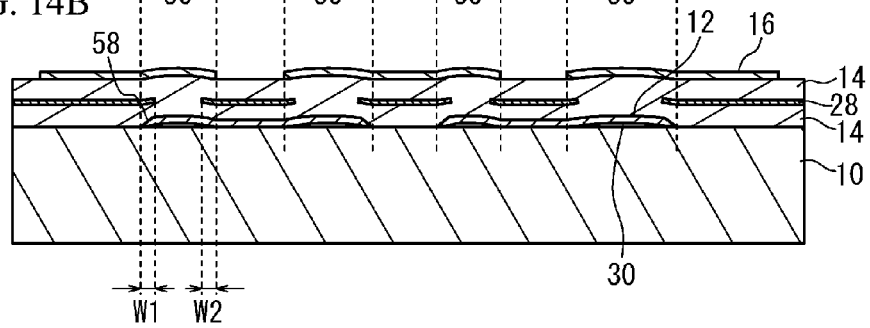
FIG. 14B illustrates a cross sectional view taken along a line A-A of FIG. 14A.

FIG. 14A illustrates a plane view and a cross sectional view of the transmit filter. FIG. 14B illustrates a cross sectional view taken along a line A-A of FIG. 14A. As illustrated in FIG. 14A and FIG. 14B, the piezoelectric thin film resonators in accordance with the third embodiment may be formed on the same substrate 10 and may be used as a ladder filter. An opening 36 is formed in the piezoelectric film 14, and an opening is formed in the inserted film 28. The lower electrode 12 can be electrically connected with an outer component via the opening 36 and the opening of the inserted film 28. With respect to the width of the inserted film 28 in the resonance region 50, the width W1 on the side for extracting the upper electrode 16 is larger than the width W2 on the side for extracting the lower electrode 12. Other structures are the same as the third embodiment. An explanation of the structures is omitted. The size and the shape of the resonance regions 50 of the resonators S1 to S4 and P1 to P3 can be arbitrarily changed.

The receive filter 42 may be a ladder type filter or a multiplex mode filter. At least one of the transmit filter 40 and the receive filter 42 may be a ladder type filter or a lattice type filter. At least one of the resonators of the transmit filter 40 and the receive filter 42 may be one of the piezoelectric thin filter resonators of the first embodiment to the fourth embodiment and the modified embodiment.

The filter includes one of the piezoelectric thin film resonators of the first embodiment to the fourth embodiment and the modified embodiment. Thus, the Q value of the resonator can be improved. And, the skirt characteristic of the filter can be improved.

At least one of the transmit filter 40 and the receive filter 42 may be used as the filter including one of the piezoelectric thin film resonators of the first embodiment to the fourth embodiment and the modified embodiment.

The present invention is not limited to the specifically described embodiments, but other embodiments and variations may be made without departing from the scope of the claimed invention.

What is claimed is:

1. A piezoelectric thin film resonator comprising:
   a substrate;
   a piezoelectric film that is provided on the substrate;
   a lower electrode and an upper electrode that sandwich at least a part of the piezoelectric film and face with each other; and
   an inserted film that is inserted in the piezoelectric film, is provided in an outer circumference region of a resonance region in which the lower electrode and the upper electrode sandwich the piezoelectric film and face with each other and is not provided in a center region of the resonance region,
   wherein:
   an angle between an edge face of the lower electrode and a lower face of the lower electrode in the resonance region is an acute angle; and
   a width of the inserted film in the resonance region on a side for extracting the upper electrode from the resonance region is larger than another width of the inserted film in the resonance region on a side for extracting the lower electrode from the resonance region.

2. The piezoelectric thin film resonator as claimed in claim 1, wherein the angle is smaller than an angle between an edge face and a lower face of the upper electrode.

3. The piezoelectric thin film resonator as claimed in claim 1, wherein a difference between the width of the inserted film in the resonance region on the side for extracting the upper electrode from the resonance region and the another width of the inserted film in the resonance region on the side for extracting the lower electrode from the resonance region is a length corresponding to a length of the edge face in a face direction of the substrate.

4. The piezoelectric thin film resonator as claimed in claim 1, wherein Young's modulus of the inserted film is smaller than that of the piezoelectric film.

5. The piezoelectric thin film resonator as claimed in claim 1, wherein the piezoelectric film includes aluminum nitride as a main component.

6. The piezoelectric thin film resonator as claimed in claim 1, wherein a cavity is formed between the substrate and the lower electrode or between the substrate and an insulating film contacting the lower electrode, in the resonance region.

7. The piezoelectric thin film resonator as claimed in claim 1, wherein the resonance region has a sound reflecting film that reflects an acoustic wave propagating in the piezoelectric film on an opposite side of the lower electrode with respect to the piezoelectric film.

8. A filter comprising a piezoelectric thin film resonator, the piezoelectric thin film resonator comprising:
   a substrate;
   a piezoelectric film that is provided on the substrate;
   a lower electrode and an upper electrode that sandwich at least a part of the piezoelectric film and face with each other; and
   an inserted film that is inserted in the piezoelectric film, is provided in an outer circumference region of a resonance region in which the lower electrode and the upper electrode sandwich the piezoelectric film and face with each other and is not provided in a center region of the resonance region,
   wherein:
   an angle between an edge face of the lower electrode and a lower face of the lower electrode in the resonance region is an acute angle; and
   a width of the inserted film in the resonance region on a side for extracting the upper electrode from the resonance region is larger than another width of the inserted film in the resonance region on a side for extracting the lower electrode from the resonance region.

9. A duplexer comprising:
   a transmit filter; and
   a receive filter,
   wherein at least one of the transmit filter and the receive filter is a filter having a piezoelectric thin film resonator, the piezoelectric thin film resonator comprising:
   a substrate;
   a piezoelectric film that is provided on the substrate;
   a lower electrode and an upper electrode that sandwich at least a part of the piezoelectric film and face with each other; and an inserted film that is inserted in the piezoelectric film, is provided in an outer circumference region of a resonance region in which the lower electrode and the upper electrode sandwich the piezoelectric film and face with each other and is not provided in a center region of the resonance region, wherein:

an angle between an edge face of the lower electrode and a lower face of the lower electrode in the resonance region is an acute angle; and a width of the inserted film in the resonance region on a side for extracting the upper electrode from the resonance region is larger than another width of the inserted film in the resonance region on a side for extracting the lower electrode from the resonance region.

* * * * *